United States Patent
Yamaguchi

[11] Patent Number: 6,166,430
[45] Date of Patent: Dec. 26, 2000

[54] LEAD FRAME, METHOD FOR MANUFACTURING THE FRAME, RESIN-MOLDED SEMICONDUCTOR DEVICE AND METHOD FOR MANUFACTURING THE DEVICE

[75] Inventor: Yukio Yamaguchi, Shiga, Japan

[73] Assignee: Matsushita Electronics Corporation, Osaka, Japan

[21] Appl. No.: 09/244,073

[22] Filed: Feb. 4, 1999

[30] Foreign Application Priority Data

May 27, 1998 [JP] Japan .................................. 10-145336

[51] Int. Cl.⁷ .................................................. H01L 23/495
[52] U.S. Cl. ........................... 257/666; 257/787; 257/676
[58] Field of Search ...................... 257/666, 676, 257/670, 787, 796

[56] References Cited

U.S. PATENT DOCUMENTS

| | | |
|---|---|---|
| 5,294,827 | 3/1994 | McShane . |
| 5,521,429 | 5/1996 | Aono et al. . |
| 5,841,187 | 11/1998 | Sigimoto et al. . |
| 5,844,307 | 12/1998 | Suzuki et al. . |
| 5,900,676 | 5/1999 | Kweon et al. . |
| 5,973,388 | 10/1999 | Chew et al. . |
| 5,977,613 | 11/1999 | Takata et al. . |

*Primary Examiner*—Sheila V. Clark
*Attorney, Agent, or Firm*—McDermott, Will & Emery

[57] ABSTRACT

The lead frame of the present invention includes: an outer frame having an opening; a plurality of leads consisting of outer and signal-connecting leads and extending inside the opening from the outer frame toward a region in which the semiconductor chip is mounted; a die pad disposed inside the opening; and a plastic film adhered to respective lower surfaces of the die pad, the outer frame and the signal-connecting leads. This lead frame is not provided with support leads and the die pad is indirectly supported by the outer frame with the plastic film. Since no support leads are provided, the size of an installable semiconductor chip can be enlarged and the overall size of a semiconductor device can be reduced.

14 Claims, 13 Drawing Sheets

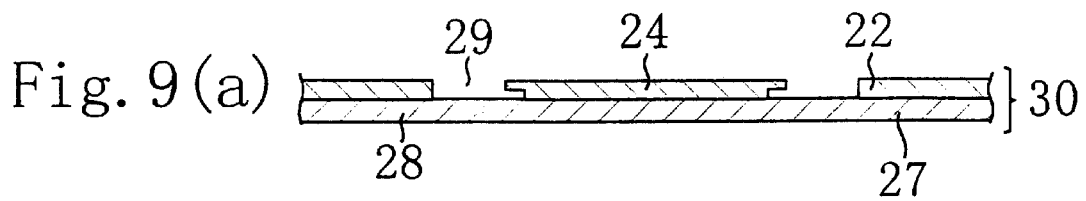
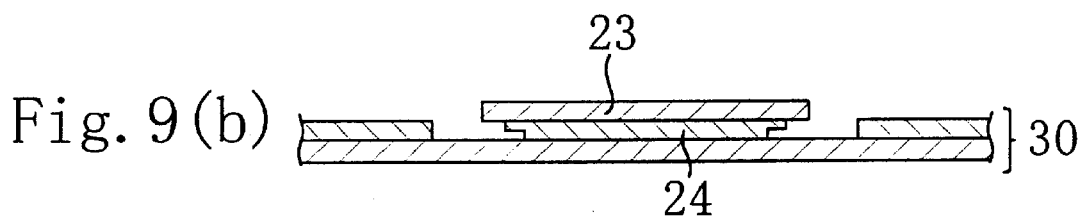
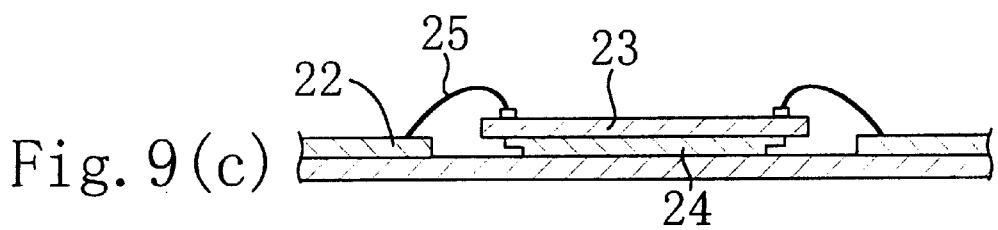
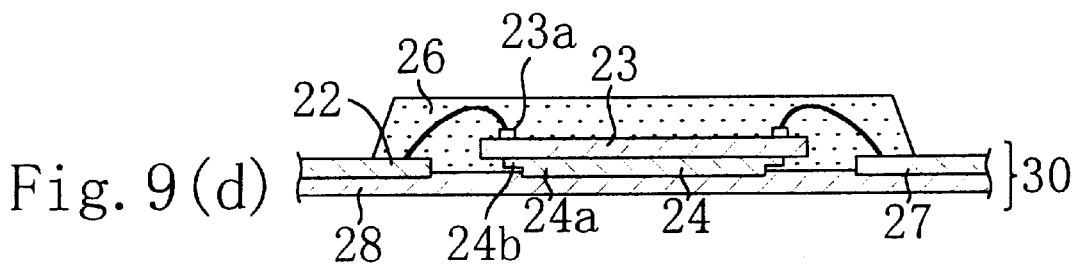
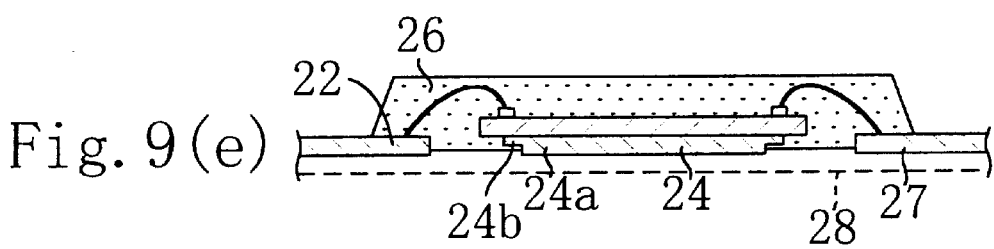
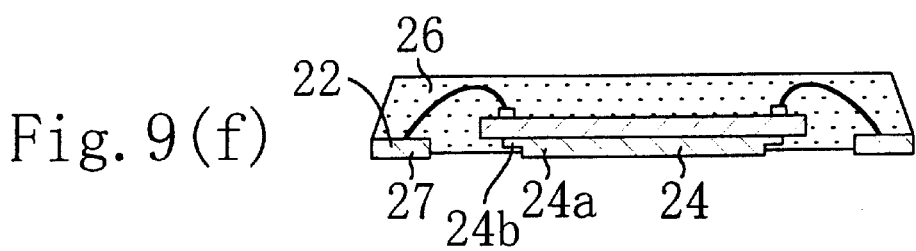

LEAD FRAME, METHOD FOR MANUFACTURING THE FRAME, RESIN-MOLDED SEMICONDUCTOR DEVICE AND METHOD FOR MANUFACTURING THE DEVICE

BACKGROUND OF THE INVENTION

The present invention relates to a resin-molded semiconductor device in which a semiconductor chip and signal-connecting leads to be connected to the chip are encapsulated with a resin encapsulant, a method for manufacturing the device, a lead frame used for the device, and a method for manufacturing the lead frame.

In recent years, in order to catch up with rapidly advancing downsizing of an electronic appliance, it has become increasingly necessary to package semiconductor devices in the electronic appliance with higher and higher density. Such a semiconductor device is typically formed by encapsulating a semiconductor chip, including a plurality of semiconductor components, with a resin encapsulant. Thus, a semiconductor device of this type is called a "resin-molded semiconductor device". Accordingly, sizes and thicknesses of such resin-molded semiconductor devices have also been noticeably and drastically reduced to meet the demand for high-density packaging. Hereinafter, a conventional resin-molded semiconductor device will be described with reference to the accompanying drawings.

FIG. 16(*a*) is a plan view of a conventional resin-molded semiconductor device, in which only the contour of a resin encapsulant is illustrated by regarding the encapsulant as being transparent for convenience. FIG. 16(*b*) is a cross-sectional view of the device taken along the line XVIb—XVIb in FIG. 16(*a*). As shown in FIGS. 16(*a*) and 16(*b*), the conventional resin-molded semiconductor device is of the single-side encapsulated type where external terminals are arranged along the outer periphery on the lower surface thereof.

The conventional resin-molded semiconductor device uses a lead frame consisting of: inner leads 101; a die pad 102; and support leads 103 for supporting the die pad 102. A semiconductor chip 104 is bonded onto the die pad 102 of the lead frame with an adhesive, and electrode pads (not shown) of the chip 104 are electrically connected to the inner leads 101 with metal fine wires 105 used as connecting members. And part of the inner leads 101, the die pad 102, semiconductor chip 104, part of support leads 103 and metal fine wires 105 are encapsulated with a resin encapsulant 106.

In this resin-molded semiconductor device, no resin encapsulant 106 exists on the respective lower surfaces of the inner leads 101. In other words, the respective lower surfaces of the inner leads 101 are exposed and the respective lower parts of the inner leads 101, including the exposed lower surfaces thereof, are used as outer leads 107. To improve adhesion between the resin encapsulant 106 and the inner leads 101 or the die pad 102, side faces of the leads 101 and pad 102 are shaped like a taper with an upwardly increasing thickness, not to extend perpendicularly to the upper and lower surfaces of the frame.

In such a resin-molded semiconductor device, the respective lower surfaces of the resin encapsulant 106 and the die pad 102 are both located on the same plane. Stated otherwise, the lower surface of the lead frame is not substantially encapsulated. Accordingly, the thickness of such a semiconductor device is thinner than usual.

Hereinafter, it will be outlined how to manufacture the resin-molded semiconductor device shown in FIGS. 16(*a*) and 16(*b*).

First, a lead frame including inner leads 101 and a die pad 102 is prepared and then wrought mechanically or chemically to shape the side faces of respective parts of the lead frame like a taper.

Next, a semiconductor chip 104 is bonded onto the die pad 102 of the lead frame prepared, and is electrically connected to the inner leads 101 with metal fine wires 105. As the metal fine wires 105, aluminum (Al) or gold (Au) fine wires may be appropriately used, for example.

Then, the lead frame, on which the semiconductor chip 104 has been bonded, is introduced into a die assembly and transfer-molded. In particular, resin molding is performed with the lower surface of the lead frame in contact with an upper or lower die of the die assembly. That is to say, the die pad 102, semiconductor chip 104, inner leads 101, part of the support leads 103 and metal fine wires 105 are encapsulated within a resin encapsulant 106.

After the step of encapsulating has been performed, parts of outer leads 107, protruding outward from the resin encapsulant 106, are cut off to have a predetermined length, thereby completing a resin-molded semiconductor device.

In such a conventional resin-molded semiconductor device manufactured this way, the support leads might possibly be deformed during the manufacturing process step thereof. Then, the die pad, to be supported by the support leads, might be unintentionally out of balance and tilt or be displaced upward as a result. In such a case, the resin encapsulant would sometimes reach the lower surface of the die pad to form so-called "resin burr". If such resin burr exists on the lower surface of the die pad, then desired characteristics might not be attained in terms of heat radiation, for example. This is because the die pad could not be in satisfactory contact with a heat-radiating pad to be aligned with the die pad on a motherboard.

Such resin burr can be removed by using water jet or the like. However, such a deburring process is not just troublesome, but causes additional problems. Specifically, if a water jet process is carried out, then a nickel (Ni), palladium (Pd) or gold (Au) plated layer might peel off from the leads and impurity might deposit on the exposed parts thereof. Accordingly, such parts exposed on the resin encapsulant should be plated once again after the encapsulation. As a result, work efficiency and reliability of the device might possibly deteriorate.

In order to avoid such a problem, tilting of the die pad can be prevented by providing a bent portion, functioning as a spring, for each of the support leads to cushion the pressure causing the deformation of the support lead. However, if such a bent portion is provided for each support lead, then part of the support lead should be raised upward. Accordingly, a semiconductor chip cannot be mounted but inside a region defined by the respective raised portions of the support leads. That is to say, supposing the overall size of a resin-molded semiconductor device is constant, the size of an installable semiconductor chip is restricted if such bent portions are formed. Stated otherwise, the overall size of a resin-molded semiconductor device cannot be reduced below a certain limit. In addition, raising a part of each support lead upward imposes unwanted restriction on the reduction in thickness of a resin-molded semiconductor device using such support leads.

Also, the conventional resin-molded semiconductor device has a structure where the resin encapsulant is adhered to substantially one face only of the lead frame having the semiconductor chip mounted thereon, i.e., the upper face of the lead frame, to reduce the resulting thickness. In other words, since the contact area between the lead frame and the resin encapsulant is smaller than usual, the adhesion therebetween is less than satisfactory. Therefore, water or moisture is more likely to penetrate between the die pad and the resin encapsulant, resulting in even poorer adhesion between these members or forming cracks in the encapsulant. What is worse, since the die pad cannot adhere to the encapsulant, either, the moisture resistance of the device might possibly deteriorate.

SUMMARY OF THE INVENTION

An object of the present invention is providing a resin-molded semiconductor device that can have a reduced size or thickness by taking various measures to install the largest possible semiconductor chip within a resin encapsulant without causing a die pad to tilt, and a method for manufacturing the device.

Another object of the present invention is providing a lead frame suitable for manufacturing such a resin-molded semiconductor device, and a method for manufacturing the lead frame.

The lead frame of the present invention includes: an outer frame having an opening surrounding a region in which a semiconductor chip is mounted; a plurality of leads extending inside the opening from the outer frame toward the region in which the semiconductor chip is mounted; a die pad disposed inside the opening of the outer frame; and a plastic film adhered to respective lower surfaces of the outer frame, the leads and the die pad. The die pad, outer frame and leads are separated from each other, and the die pad is secured to the outer frame with the plastic film.

In this structure, the die pad is secured to part of the plastic film exposed inside the opening of the outer frame, and no support leads are provided. Accordingly, the restriction imposed by the shape of a support lead on the size of an installable semiconductor chip can be lightened, thus realizing a lead frame contributing to the manufacturing of a downsized resin-molded semiconductor device that can be mounted with more reliability.

In one embodiment of the present invention, the die pad may be thicker than the leads, and the upper surface of the die pad may be located above the upper surfaces of the leads.

In such an embodiment, the restriction on the size of a semiconductor chip can be eased and the overall size of a resin-molded semiconductor device can be further reduced.

In another embodiment of the present invention, the die pad may include a flange portion on the outer periphery thereof, the lower surface of the flange portion being located above the lower surface of the other portion of the die pad.

In such a structure, a resin encapsulant can reach the lower part of a die pad during encapsulation. Accordingly, this lead frame can make it possible to manufacture a highly reliable resin-molded semiconductor device with adhesion between the resin encapsulant and the die pad improved.

In still another embodiment, upper part of each said lead may be larger in width than lower part thereof, and a plurality of grooves may be formed in the upper surface of each said lead.

This lead frame can also enable the manufacturing of a highly reliable resin-molded semiconductor device with adhesion between the resin encapsulant and the die pad improved.

In still another embodiment, each said lead may include a reduced thickness portion facing the die pad, the lower surface of the reduced thickness portion being located above the lower surface of the other portion of the lead.

This structure can relax the stress applied to portions of the semiconductor chip and leads that are connected to each other with metal fine wire or the like.

A method for manufacturing a lead frame according to the present invention includes the steps of: a) preparing a main lead frame unit including: an outer frame having an opening surrounding a region in which a semiconductor chip is mounted; and a plurality of leads extending inside the opening from the outer frame toward the region, each said lead including a reduced thickness portion at one end thereof closer to the region, the portion being formed by removing lower part of the lead; b) attaching an adhesive plastic film to the lower surface of the main lead frame unit; and c) securing a die pad onto a region of the plastic film exposed inside the opening of the main lead frame unit.

In accordance with this method, the inventive lead frame structure can be obtained easily at a lower cost.

The resin-molded semiconductor device of the present invention includes: a semiconductor chip having electrode pads; a die pad for supporting the semiconductor chip thereon; a plurality of leads connected to the electrode pads of the semiconductor chip, each said lead including a reduced thickness portion connected to associated one of the electrode pads and formed by removing lower part of the lead; a plurality of connecting members for electrically connecting the electrode pads of the semiconductor chip to the leads; a plurality of external terminals for electrically connecting the leads to an external member, each said external terminal being part of associated one of the leads; and a resin encapsulant for encapsulating the die pad, the semiconductor chip, the leads and the connecting members. Respective lower surfaces of the die pad and the leads are not encapsulated with the resin encapsulant but exposed. The die pad, the outer frame and the leads are separated from each other. And the die pad is substantially supported by the resin encapsulant.

In this structure, the die pad is secured to part of the plastic film exposed inside the opening of the outer frame of the lead frame, and no support leads are provided. Accordingly, the restriction imposed by the shape of a support lead on the size of an installable semiconductor chip can be lightened, thus obtaining a downsized resin-molded semiconductor device that can be mounted with more reliability. In addition, since the portion of each lead, connected to associated electrode pad of the semiconductor chip, has a reduced thickness, the stress applied to the connection portion can be relaxed.

In one embodiment of the present invention, the die pad may be thicker than the leads, and the upper surface of the die pad may be located above the upper surfaces of the leads.

In such an embodiment, a downsized resin-molded semiconductor device can be obtained.

In another embodiment of the present invention, the die pad may include a flange portion on the outer periphery thereof, the lower surface of the flange portion being located above the lower surface of the other portion of the die pad.

In such an embodiment, it is possible to obtain a highly reliable resin-molded semiconductor device with adhesion between the resin encapsulant and the die pad improved.

In still another embodiment, upper part of each said lead may be larger in width than lower part thereof, and a plurality of grooves may be formed in the upper surface of each said lead.

In such an embodiment, it is possible to obtain a highly reliable resin-molded semiconductor device with improved adhesion between the resin encapsulant and the leads and increased moisture resistance.

In still another embodiment, respective lower parts of the die pad and the leads may protrude downward from the lower surface of the resin encapsulant, and the respective lower parts of the leads may function as the external terminals.

In such an embodiment, the work of mounting a resin-molded semiconductor device onto a motherboard can be carried out with more efficiency.

A method for manufacturing a resin-molded semiconductor device according to the present invention includes the steps of: a) preparing a lead frame, the lead frame including: an outer frame having an opening; a plurality of leads extending inside the opening from the outer frame toward a region in which a semiconductor chip is mounted; a die pad disposed inside the opening of the outer frame; and a plastic film adhered to respective lower surfaces of the outer frame, the leads and the die pad, where the die pad, the outer frame and the leads are separated from each other and the die pad is secured to the outer frame with the plastic film; b) mounting the semiconductor chip onto the die pad of the lead frame; c) electrically connecting the semiconductor chip to the leads with connecting members; d) pouring a resin encapsulant into a die assembly while applying pressure to the outer frame and respective parts of the leads of the lead frame to encapsulate the semiconductor chip, the parts of the leads, the connecting members and the die pad within the resin encapsulant on the upper surface of the plastic film, the parts of the leads being closer to the outer frame; e) removing the plastic film after the encapsulation, thereby exposing the respective lower surfaces of the die pad and the leads; and f) cutting off parts of the leads protruding outward from the resin encapsulant, thereby separating the outer frame from the leads.

In accordance with this method, the inventive resin-molded semiconductor device can be obtained easily.

BRIEF DESCRIPTION OF THE DRAWINGS

FIGS. 9(a) through 9(f) are cross-sectional views illustrating respective process steps for manufacturing the resin-molded semiconductor device of the second embodiment.

DESCRIPTION OF THE PREFERRED EMBODIMENTS

Embodiment 1

Hereinafter, structure of a lead frame, method for manufacturing the frame, structure of a resin-molded semiconductor device including the frame, and method for manufacturing the device according to the first embodiment of the present invention will be described separately.

Structure of lead frame

Figure 1:
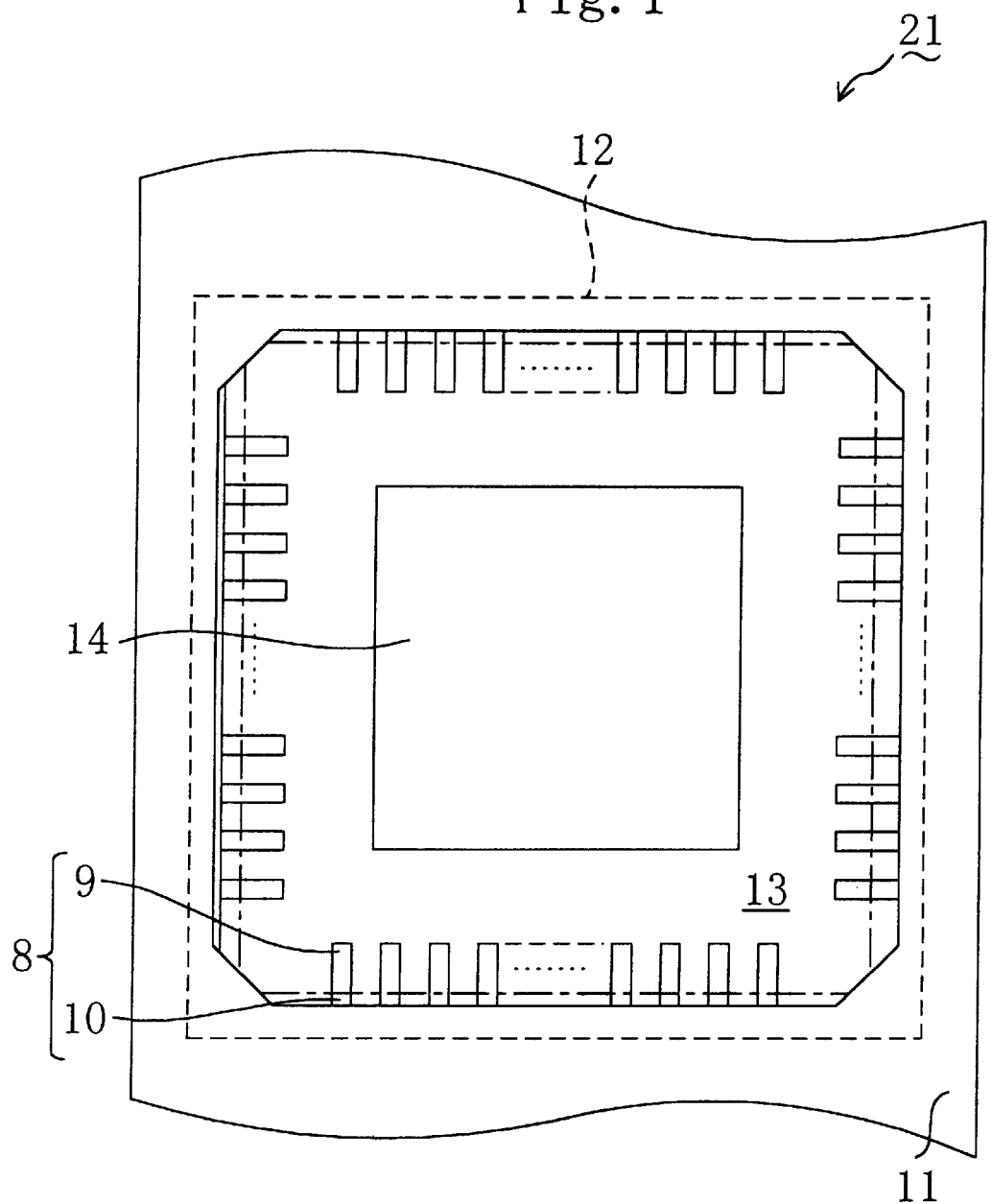
FIG. 1 is a plan view of a lead frame according to the first embodiment of the present invention.

FIG. 1 is a plan view of a lead frame 21 of this embodiment. As shown in FIG. 1, the lead frame 21 includes: an outer frame 11; leads 8; a square die pad 14; and a plastic film 12. The outer frame 11 has a substantially square opening 13 surrounding a region in which a semiconductor chip is mounted. The leads 8 consist of outer leads 10 and signal-connecting leads 9 that are continuous with the outer leads 10. The outer leads 10 extend inside the opening 13 from respective sides of the outer frame 12 toward the die pad 14. The die pad 14 is disposed at substantially the center of the opening 13. And the plastic film 12 is adhered to respective lower surfaces of the die pad 14, outer frame 11 and signal-connecting leads 9. The semiconductor chip can be mounted onto the die pad 14. And each of the signal-connecting leads 9 extends to reach a region near or beneath the semiconductor chip to be mounted on the die pad 14.

In FIG. 1, the broken line indicates the contour of the plastic film 12, while the one-dot chain indicates an encapsulating line inside which the chip, die pad 14 and part of leads 8 are encapsulated after the semiconductor chip has been mounted on the die pad 14. Part of each lead 8 outside of the encapsulating line is an outer lead 10, while the other part of each lead 8 inside the line is a signal-connecting lead 9. Dam bars, which are ordinarily provided in the boundary between the outer leads 10 and signal-connecting leads (inner leads) 9 of the leads 8 for preventing the outflow of a resin encapsulant during encapsulation, are not provided for the lead frame 21 of this embodiment.

The shape and thickness of the die pad 14 of the lead frame 21 of this embodiment may be appropriately determined depending on the characteristics of transistors, etc. included in a semiconductor chip to be mounted, the size and thickness of the chip, mounting conditions and reliability required. However, the thickness of the die pad 14 is preferably equal to or larger than that of the signal-connecting leads 9. Also, the lower part of the die pad 14 may have a level difference. That is to say, a flange portion, the thickness of which is smaller than that of the portion inside the flange portion, may be formed on the outer periphery of the lower part of the die pad 14.

The same metal plate, used as a material for the outer frame 11 and the leads 8 of the lead frame 21, is broadly applicable in common to die pads 14 of various sizes and slightly different thicknesses.

It should be noted, however, that the lead frame 21 of this embodiment is not constituted by only a single unit consisting of the opening 13, the leads 8 and the die pad 14 as shown in FIG. 1. Instead, the lead frame 21 includes a plurality of such units that have the same pattern and are arranged in columns and rows on the same metal plate.

In the lead frame 21 of this embodiment, the signal-connecting leads 9, the outer leads 10 and the outer frame 11 are respective parts of the same conductive metal plate. Alternatively, the outer frame 11 and the leads 8 may be made of mutually different metal plates.

The plastic film 12 may be any resin-based film, which is mainly composed of polyethylene terephthalate, polyimide, polycarbonate or the like. Optionally, the plastic film 12 may be made of any other arbitrary material so long as the film 12 can be easily peeled off after the encapsulation and has some resistance to an elevated-temperature environment during the encapsulation.

Figure 16A:
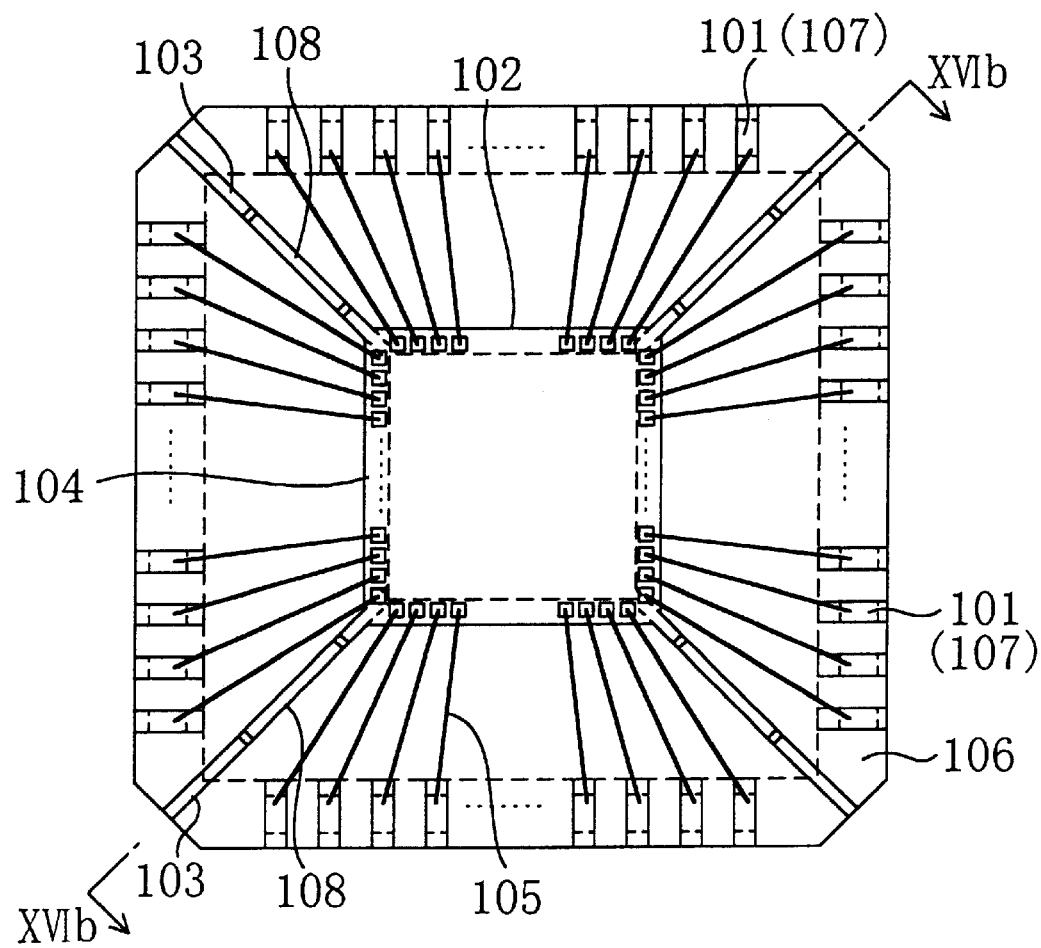
FIG. 16(a) is a plan view of a conventional resin-molded semiconductor device.
Figure 16B:
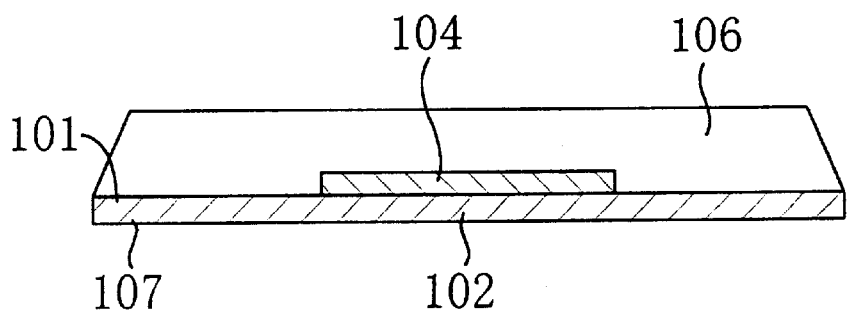
FIG. 16(b) is a cross-sectional view of the device taken along the line XVIb—XVIb in FIG. 16(a).

The lead frame 21 of this embodiment is characterized by not including any support leads (identified by 108 in FIG. 16(a)) directly connecting the die pad 14 to the outer frame 11. Instead, the die pad 14 is indirectly secured to the outer frame 11 with the plastic film 12.

By employing such a structure that the die pad 14 is secured to the plastic film 12, the following effects can be attained.

Firstly, the die pad 14 can be disposed inside the opening 13 of the outer frame 11 without providing any support leads indispensable for a conventional device. Since no support leads are provided, the displacement of the die pad 14, which usually results from the deformation of support leads during encapsulation, can be eliminated. Accordingly, no members, like bent portions, interfering with a semiconductor chip are provided around the die pad 14 to cushion the pressure causing the deformation of the support leads. Therefore, an installable semiconductor chip can be expanded as close as possible to respective sides of the opening 13 of the outer frame 11. Stated otherwise, supposing the size of a semiconductor chip is constant, the overall size of a resin-molded semiconductor device can be smaller than a conventional one. Also, since respective lower surfaces of the die pad 14, outer frame 11 and leads 8 are attached to the plastic film 12, the overall thickness of the resin-molded semiconductor device can also be reduced.

Secondly, the plastic film 12 can also be used as a mask preventing the resin encapsulant from reaching the lower surface of the die pad 14 or respective lower parts of the signal-connecting leads 9 functioning as external terminals. Specifically, during the step of encapsulating, the plastic film 12 and the lead frame 21 are clamped by upper and lower dies of a die assembly. Accordingly, it is possible to prevent resin burr from being formed on the lower surface of the die pad 14 or the portions used as external terminals. It should be noted that the "resin burr" is an unwanted resin residue, which is attached to a surface of the lead frame 21 to be exposed after the encapsulation and causes various inconveniences described above.

Thirdly, either the upper or lower die of the die assembly used for encapsulation is not in contact with the resin encapsulant, because the plastic film 12 is interposed therebetween. Accordingly, not only the formation of resin burr can be prevented, but also extruding pins used for releasing the assembly from the dies after the encapsulation or quenching performed through the encapsulant to prevent the deformation of the dies is not necessary. Thus, the structure of the die assembly can be simplified and manufacturing costs can be cut down, because the equipment costs and work time for encapsulation can be both reduced.

Manufacturing process of lead frame

Figure 2:
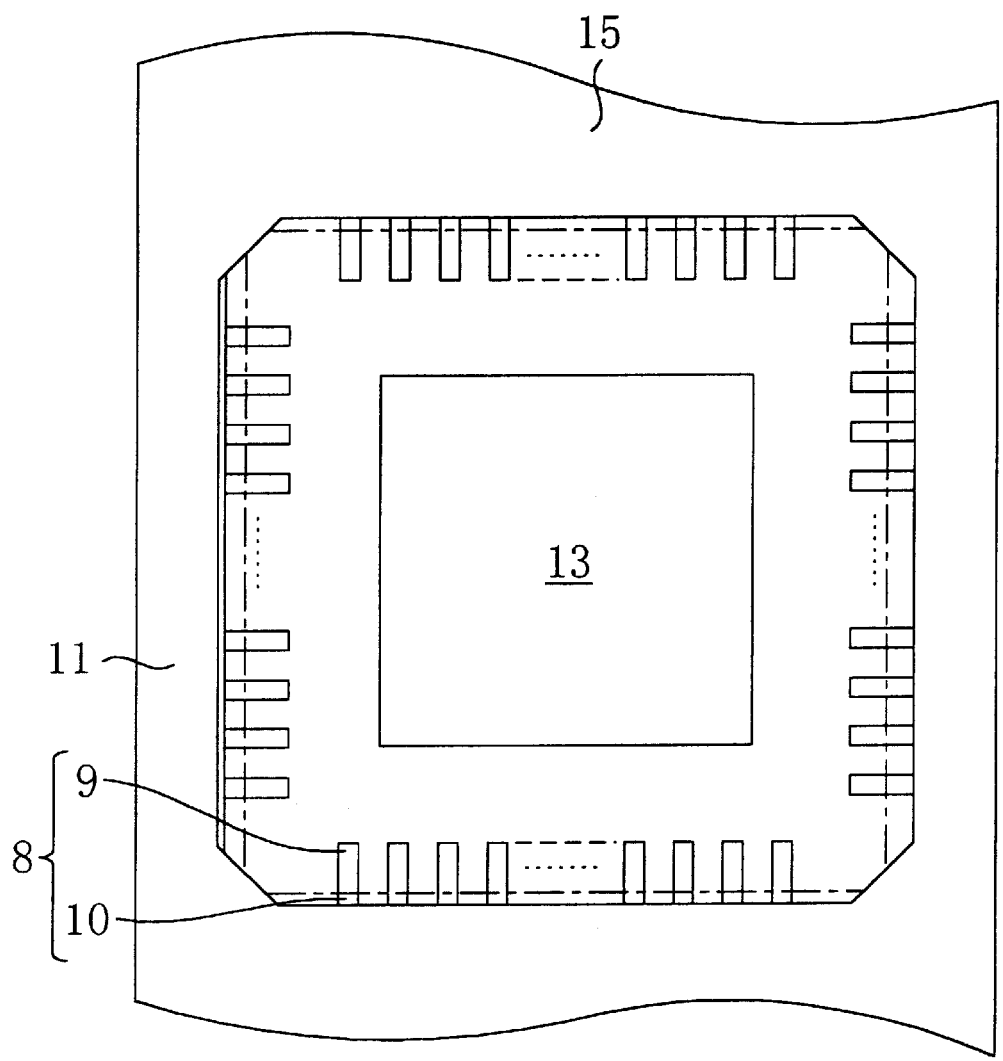
FIG. 2 is a plan view illustrating the step of forming a main lead frame unit during a manufacturing process of the lead frame in the first embodiment.
Figure 3:
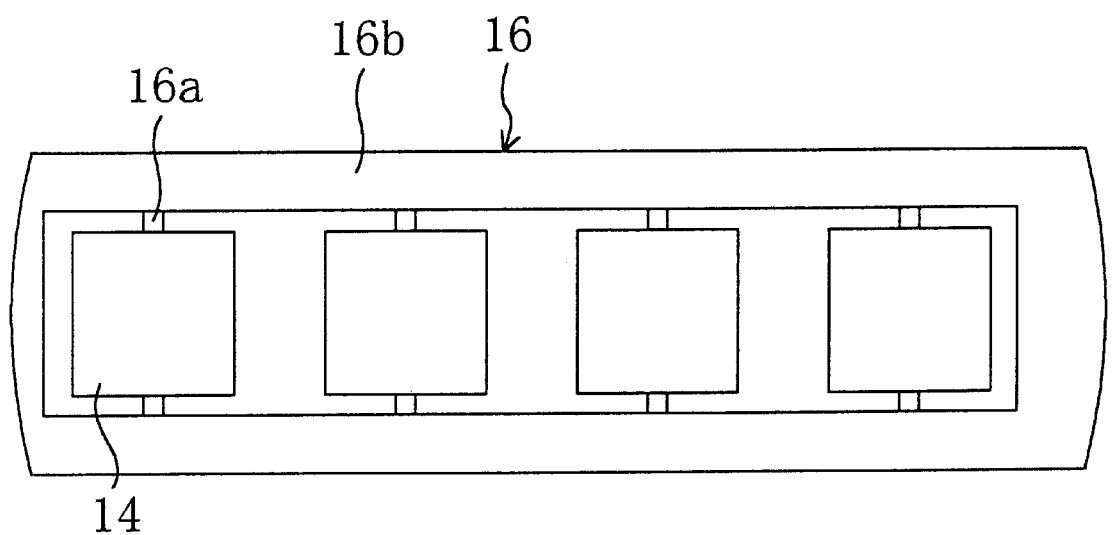
FIG. 3 is a plan view illustrating the step of forming a pad assembly during the manufacturing process of the lead frame in the first embodiment.
Figure 4:
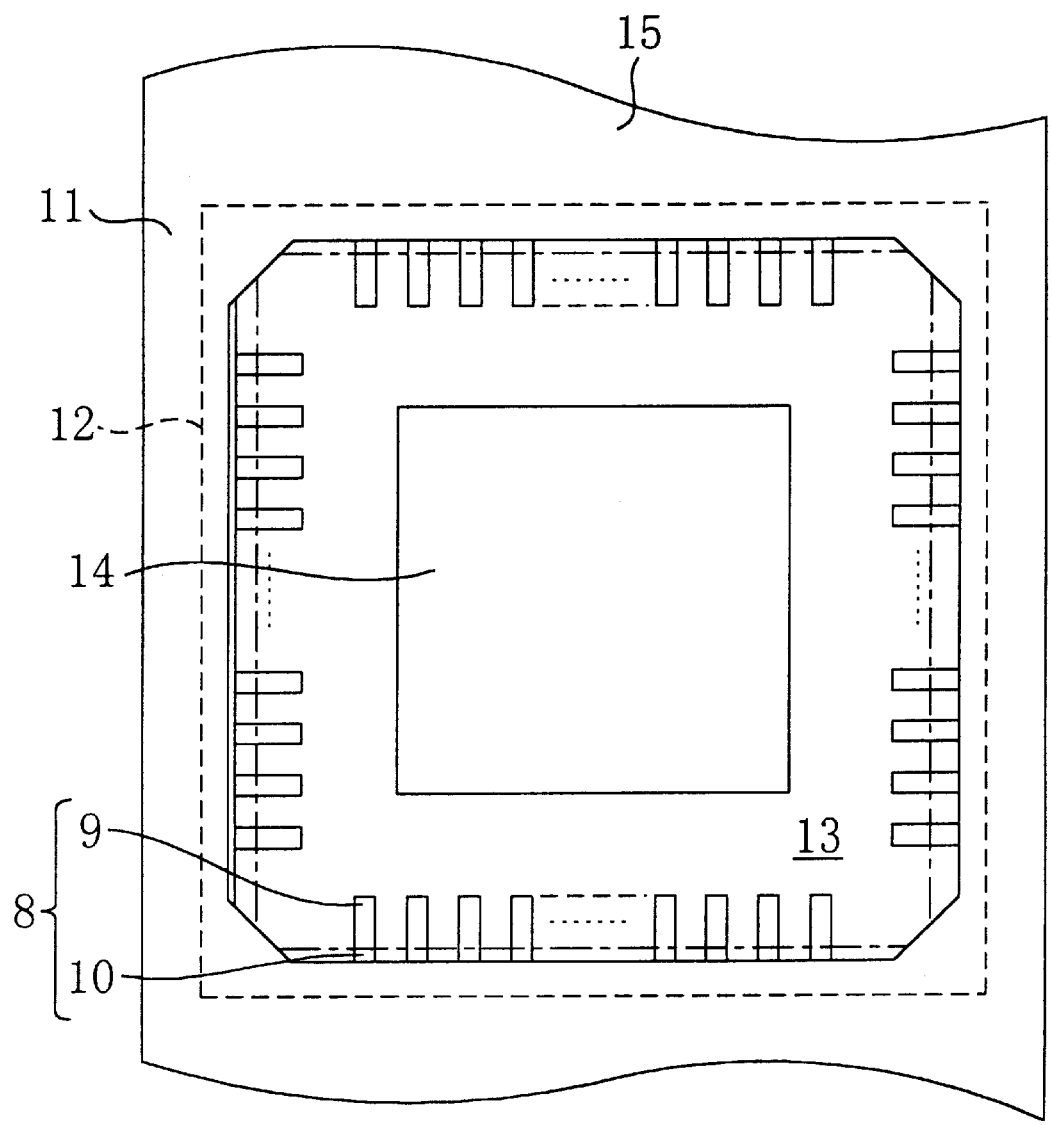
FIG. 4 is a plan view illustrating the step of bonding the die pad onto the main lead frame unit during the manufacturing process of the lead frame in the first embodiment.

Next, a method for manufacturing the lead frame of this embodiment will be described. FIGS. 2 through 4 are plan views sequentially illustrating respective process steps for manufacturing the lead frame of this embodiment.

First, in the process step shown in FIG. 2, a metal plate for the lead frame 21 made of copper, for example, is etched or pressed, thereby removing portions of the plate to be the openings 13 and leaving respective portions to be the outer frame 11 and the leads 8 consisting of the outer and signal-connecting leads 10, 9. As a result, main lead frame units 15, not including die pads or support leads, are obtained. It should be noted that only one of the main lead frame units 15 formed is illustrated in FIG. 2 for the sake of simplicity. In FIG. 2, the one-dot chain is an encapsulating line defined for encapsulation after the semiconductor chip has been mounted.

Then, in the process step shown in FIG. 3, a pad assembly 16 including die pads 14, connection portions 16a and a frame 16b is formed by etching or pressing another metal plate made of copper, for example, separately from the metal plate for the main lead frame units 15 shown in FIG. 2. The die pads 14 are secured to the frame 16b via the connection portions 16a. Since the connection portions 16b are formed by half etching or the like to have an extremely small thickness, the die pads 14 can be easily separated from the frame 16b of the pad assembly 16 during a subsequent process step.

Subsequently, in the process step shown in FIG. 4, a plastic film 12, having a contour indicated by the broken line in FIG. 4, is attached to the lower surface of the main lead frame unit 15. In this case, the plastic film 12 is attached to entire regions of the signal-connecting leads 9 and the outer leads 10 of the main lead frame unit 15 and to a region of the outer frame 11 surrounding the opening 13. The attachment can be performed, for example, by using an adhesive plastic film 12 for temporarily adhering the main lead frame unit 15 to the plastic film 12.

Thereafter, the pad assembly 16 is mounted on the main lead frame unit 15, thereby adhering a corresponding one of the die pads 14 to (the adhesive layer of) the plastic film 12 exposed inside the opening 13. In this process step, the connection portions 16a of the pad assembly 16 are cut off simultaneously with, or posterior to, the attachment of the die pad 14 to the plastic film 12, thereby separating the die pad 14 from the frame 16b of the pad assembly 16.

By performing these process steps, a lead frame 21 including the die pad 14, the leads 8 consisting of the signal-connecting leads 9 and the outer leads 10, and the outer frame 11 can be obtained without using any support leads.

In FIG. 4, the encapsulating line defined for encapsulation after the semiconductor chip has been mounted is indicated by a one-dot chain.

It should be noted that the main lead frame unit 15 and the die pad 14 are ordinarily plated with a metal such as nickel (Ni), palladium (Pd), silver (Ag) or gold (Au) before the plastic film 12 is attached to the lead frame 21.

In this embodiment, the thickness of the metal plate constituting the main lead frame unit 15 is about 200 $\mu$m, while that of the metal plate constituting the die pad 14 is about 300 $\mu$m. That is to say, the die pad 14 is thicker than the main lead frame unit 15 by about 100 $\mu$m. In such a case, even if a semiconductor chip larger in area than the die pad 14 is mounted, the semiconductor chip does not come into contact with the signal-connecting leads 9. Accordingly, a downsized resin-molded semiconductor device with an exposed die pad can be obtained advantageously.

Next, structure of a resin-molded semiconductor device of this embodiment and method for manufacturing the device will be described.

Structure of resin-molded semiconductor device

Figure 5A:
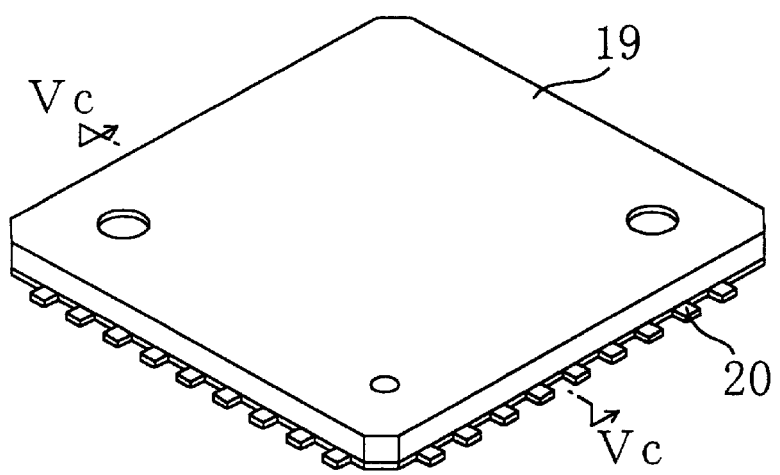
FIG. 5(a) is a perspective top view of a resin-molded semiconductor device of the first embodiment as viewed obliquely from above the device.
Figure 5B:
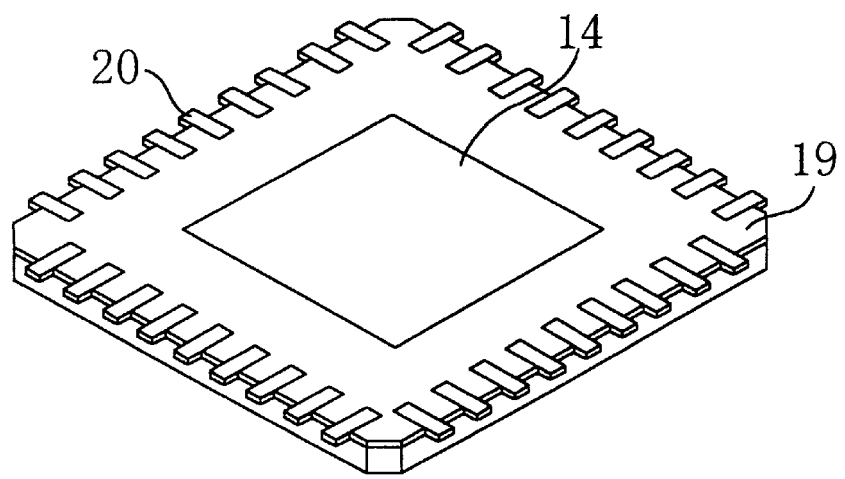
FIG. 5(b) is a perspective bottom view of the resin-molded semiconductor device of the first embodiment as viewed obliquely from below the device.
Figure 5C:
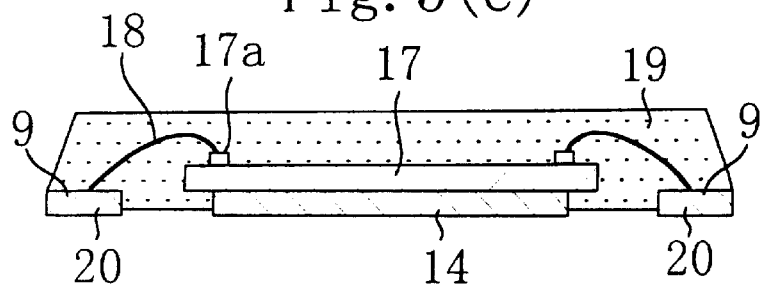
FIG. 5(c) is a cross-sectional view of the device taken along the line Vc—Vc in FIG. 5(a).
Figure 6:
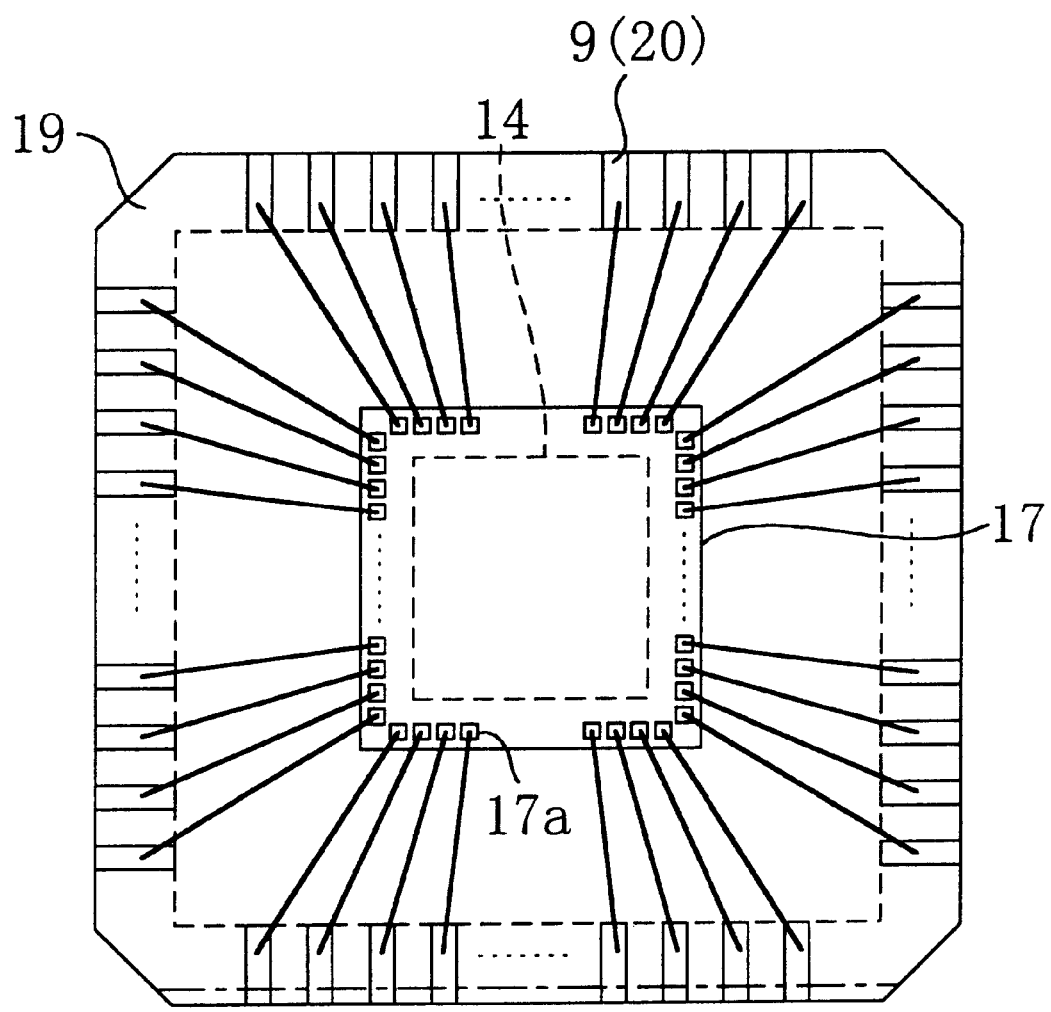
FIG. 6 is a bottom view of the resin-molded semiconductor device of the first embodiment.

FIG. 5(a) is a perspective top view of the resin-molded semiconductor device of this embodiment as viewed obliquely from above the device. FIG. 5(b) is a perspective bottom view of the resin-molded semiconductor device of this embodiment as viewed obliquely from below the device. And FIG. 5(c) is a cross-sectional view of the device taken along the line Vc—Vc in FIG. 5(a). FIG. 6 is a bottom view of the resin-molded semiconductor device of this embodiment, where the resin encapsulant is illustrated as being transparent.

As shown in FIGS. 5(a) through 5(c), the resin-molded semiconductor device of this embodiment includes: a semiconductor chip 17; a die pad 14; metal fine wires 18; signal-connecting leads 9; and a resin encapsulant 19. The semiconductor chip 17 is bonded onto the die pad 14 with an adhesive. The metal fine wires 16 are used as connecting members for electrically connecting the signal-connecting leads 9 to electrode pads 17a of the semiconductor chip 17. And the semiconductor chip 17, side faces of the die pad 14, upper and side faces of the signal-connecting leads 9 and metal fine wires 18 are encapsulated within the resin encapsulant 19.

In the resin-molded semiconductor device of this embodiment, no resin encapsulant 19 exists on the respective lower surfaces of the signal-connecting leads 9. In other words, respective lower surfaces and part of side faces of the signal-connecting leads 9 and the die pad 14 are exposed and used as interconnection with a motherboard. And the respective lower surfaces and part of side faces of the signal-connecting leads 9, exposed on the lower surface of the resin-molded semiconductor device, function as external terminals 20.

Virtually no resin burr, which ordinarily sticks out during the step of encapsulating, exists on the exposed portion of the die pad 14 and on the respective lower surfaces of the external terminals 20. This structure, in which the die pad 14 and the external terminals 20 are exposed, can be easily formed by the manufacturing process described later.

The resin-molded semiconductor device of this embodiment is characterized by the following structural features and can produce the following effects from such features.

Firstly, a downsized resin-molded semiconductor device can be obtained and various inconveniences in terms of productivity and efficiency, resulting from the deformation of support leads during the manufacturing process, can be eliminated. This is because the resin-molded semiconductor device of this embodiment is not provided with support leads for supporting the die pad 14 unlike a conventional device. In a conventional device, the size of an installable semiconductor chip is often restricted by the structure of support leads. However, since the device of this embodiment includes no support leads, such size restriction can be lightened and downsizing is realized.

Secondly, a standoff height, which should be secured for connecting the external terminals 20 and the die pad 14 to electrodes of a motherboard during mounting of the resin-molded semiconductor device onto the motherboard, has already been provided for the external terminals 20 and the die pad 14. This is because the external terminals 20 and the die pad 14 protrude downward from the lower surface of the resin encapsulant 19. Accordingly, the external terminals 20 can be used as external electrodes as they are, and there is no need to attach solder balls or the like to the external terminals 20 during mounting of the device on the motherboard. As a result, number of process steps and manufacturing cost can be advantageously reduced.

Thirdly, a downsized semiconductor device can be formed, because no outer leads, connected to the signal-connecting leads 9 and used as external terminals 20, exist around the periphery of the resin-molded semiconductor device of this embodiment as shown in FIG. 6. This is also because the respective lower parts of the signal-connecting leads 9 are used as external terminals 20. That is to say, respective end faces of the signal-connecting leads 9 do not protrude outward from, but exist on substantially the same plane as, the sides of the resin encapsulant 19. Since no leads protrude outward from the sides of the resin-molded semiconductor device, the size of such a device can be smaller. In FIG. 6, the inner broken line represents the contour of the die pad 14. As can be seen, the semiconductor chip 17 is larger in area than the die pad 14.

Manufacturing process of resin-molded semiconductor device

Next, a method for manufacturing the resin-molded semiconductor device of this embodiment will be described with reference to the drawings. FIGS. 7(a) through 7(f) are cross-sectional views illustrating respective process steps for manufacturing the resin-molded semiconductor device of this embodiment.

Figure 7A:
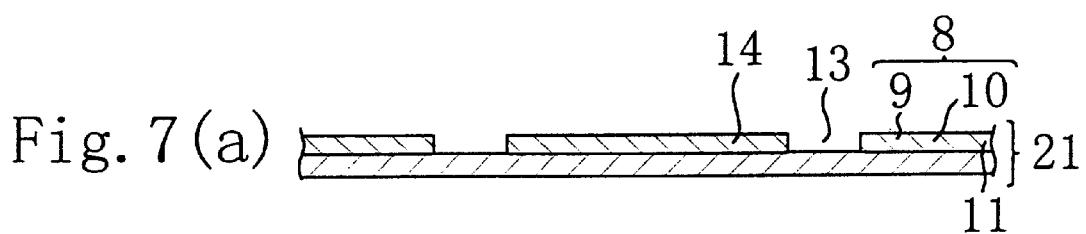
FIGS. 7(a) through 7(f) are cross-sectional views illustrating respective process steps for manufacturing the resin-molded semiconductor device of the first embodiment.

First, in the process step shown in FIG. 7(a), a lead frame 21 having the structure described above is prepared. That is to say, the lead frame 21, which is not provided with any support leads and where the die pad 14 is secured to the main lead frame unit 15 with the plastic film 12, is prepared. The lead frame 21 does not include any dam bars, which are ordinarily used for preventing the outflow of a resin encapsulant during the step of encapsulating, either. The lead frame 21 is formed by plating a frame made of copper (Cu) with the three metal layers of: an undercoat nickel (Ni) layer; a palladium (Pd) layer deposited on the Ni layer; and an outermost thin gold (Au) layer. Alternatively, the lead frame 21 may be made of any raw material other than Cu, e.g., 42 alloy member. Also, the lead frame 21 may be plated with any noble metals other than Ni, Pd and Au. Furthermore, the lead frame 21 is not necessarily plated with three layers.

Figure 7B:
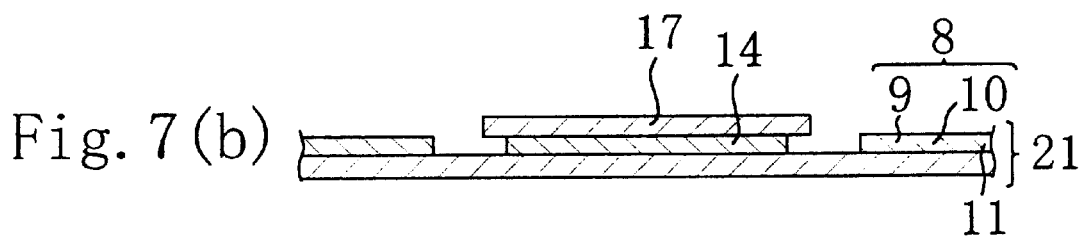

Next, in the process step shown in FIG. 7(b), a semiconductor chip 17 is mounted and bonded, with an adhesive, onto the die pad 14 of the lead frame 21 prepared. This process step is so-called "die bonding".

Figure 7C:
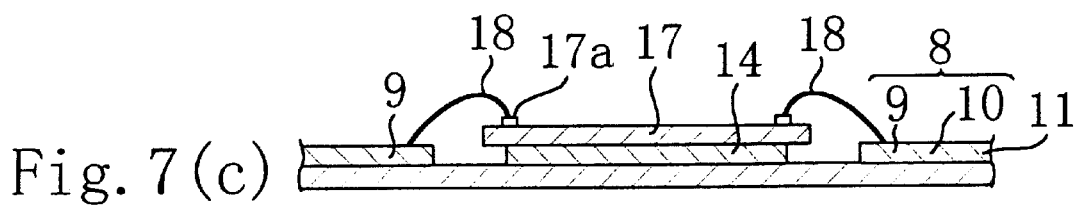

Then, in the process step shown in FIG. 7(c), the electrode pads 17a of the semiconductor chip 17, bonded to the die pad 14, are electrically connected to the signal-connecting leads 9 with metal fine wires 18. This process step is so-called "wire bonding".

Subsequently, in the process step shown in FIG. 7(d), a die assembly consisting of upper and lower dies (not shown) is prepared. And the lead frame 21, in which the semiconductor chip 17 has been mounted onto the die pad 14 and to which the plastic film 12 is still attached, is sandwiched between the upper and lower dies. Then, a resin encapsulant is poured into the die assembly with the outer periphery of the signal-connecting leads 9 of the lead frame 21 and the plastic film 12 pressed by the upper and lower dies. In this manner, the signal-connecting leads 9, semiconductor chip 17, metal fine wires 18 and die pad 14 are encapsulated with the resin encapsulant 19 on the upper surface of the plastic film 12.

Figure 7D:
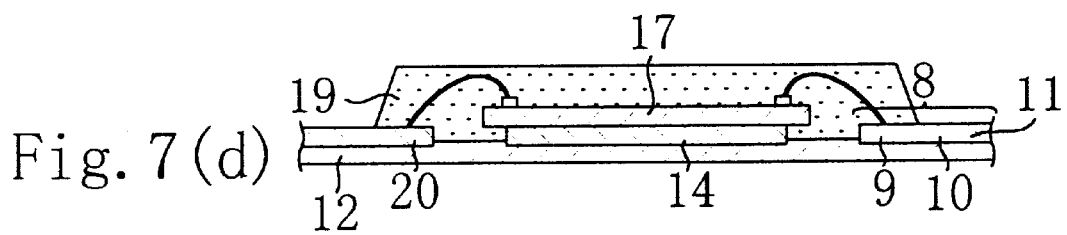

During this step of encapsulating, since the plastic film 12 is pressed by the upper and lower dies, part of the film 12, which is not in contact with the signal-connecting leads 9 or the die pad 14, is raised upward from the lower surfaces of the signal-connecting leads 9 and the die pad 14 as shown in FIG. 7(d). In particular, since the overall die assembly is heated for encapsulation, the plastic film 12 easily softens. Thus, the raised part of the film 12 can have a sufficient height.

Also, the plastic film 12 can be used as a mask preventing the resin encapsulant from reaching the lower surface of the die pad 14 or the respective lower parts of the signal-connecting leads 9 during the encapsulation. The existence of the plastic film 12 can prevent resin burr from being formed on the respective lower surfaces of the die pad 14 and the signal-connecting leads 9.

As described above, the plastic film 12 may be any resin-based film or tape, which is mainly composed of polyethylene terephthalate, polyimide, polycarbonate or-the like. Optionally, the plastic film 12 may be made of any other arbitrary material so long as the film 12 can be easily peeled off from the main lead frame unit 15 after the encapsulation and has some resistance to an elevated-temperature environment during the encapsulation. In this embodiment, a plastic film, which is mainly composed of polyimide, shows temporary adhesion and is about 50 $\mu$m thick, is used.

Figure 7E:
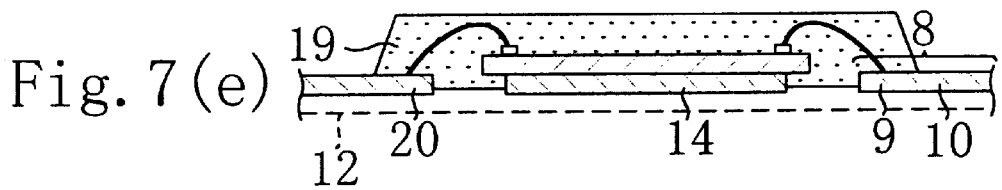

Next, in the process step shown in FIG. 7(e), the plastic film 12, which has been attached to the respective lower surfaces of the die pad 14 and the signal-connecting leads 9, is peeled off and removed. In this case, the respective lower parts of the die pad 14 and the signal-connecting leads 9 protrude downward from the back surface of the resin encapsulant 19. Parts of the signal-connecting leads 9 protruding downward from the lower surface of the resin encapsulant 19 function as external terminals 20. In this process step, the protrusion heights of the external terminals 20 and the die pad 14 can be adjusted if the thickness of the plastic film 12 is changed.

Figure 7F:
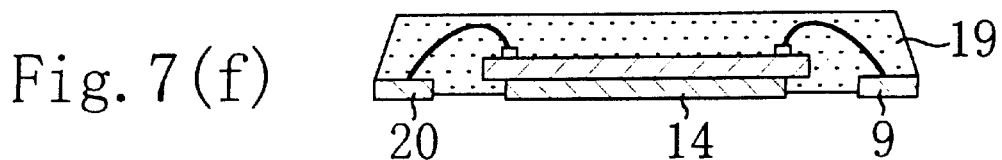

Finally, in the process step shown in FIG. 7(f), the outer leads 10 of the leads 8, which are not encapsulated with the resin encapsulant 19, are cut off by a laser cutting or pressing process in the boundary between the outer leads 10 and the signal-connecting leads 9. As a result, a resin-molded semiconductor device, in which the end faces of the signal-connecting leads 9 are located on substantially the same plane as the side faces of the resin encapsulant 19, is completed.

It should be noted that the leads 8 may be cut off before the plastic film 12, attached to the lower surfaces of the die pad 14 and the signal-connecting leads 9, is removed.

In accordance with the method of this embodiment, various inconveniences in terms of molding efficiency, which have heretofore been resulted from the existence of support leads during the step of encapsulating, can be eliminated. Specifically, formation of void in the resin encapsulant 19 or decrease in production yield can be suppressed. In addition, the number of parts, which cannot be filled completely by a conventional method with a resin encapsulant if a semiconductor chip of a large size is mounted, can also be reduced by the method of this embodiment.

Furthermore, the space, which has been reserved for support leads, can be used for arranging signal-connecting leads 9, resulting in increase in number of leads and improvement in design flexibility.

Moreover, since no support leads are provided, no interference is caused between metal fine wires 18 and the support leads during wire bonding. As a result, restriction on the work of mounting a semiconductor chip can be lightened and a resin-molded semiconductor device can be manufactured more easily.

In addition, in accordance with the method of this embodiment, the plastic film 12 is attached to the respective lower surfaces of the die pad 14 and the signal-connecting leads 9 before the step of encapsulating. Accordingly, the resin encapsulant 19 cannot reach, and no resin burr is formed on, the lower surfaces of the die pad 14 and the signal-connecting leads 9 as external terminals during the encapsulation. Thus, resin burr need not be removed from the respective lower surfaces of the die pad 14 or the external terminals 20 using water jet or the like, unlike a conventional method for manufacturing a resin-molded semiconductor device with the lower surfaces of signal-connecting leads 9 entirely exposed. That is to say, since this troublesome step of deburring can be omitted, this process is simple enough to mass-produce a great number of resin-molded semiconductor devices. In addition, peeling of metal plated layers such as Ni, Pd and Au from the lead frame and deposition of impurities, which might happen during the conventional process step of deburring using water jet, can be eliminated. As a result, the quality of these metal plated layers can be improved before the step of encapsulating.

Although the step of deburring using water jet can be omitted, the step of attaching the plastic film 12 should be additionally performed in this embodiment. However, the step of attaching the plastic film 12 is more cost-effective than the water jet process step. And it is easier to control the former process step than the latter process step. Accordingly, the process can be simplified without fail. Among other things, the method of this embodiment is particularly advantageous in that attaching the plastic film 12 can eliminate the water jet process step, which has brought about various quality-control problems like peeling of plated layers from the lead frame and deposition of impurities. Thus, in this embodiment, the plated metal layers are much less likely to peel off. Also, it is true that resin burr still could be formed in this embodiment depending on the attachment state of the plastic film 12. Even so, the resulting resin burr is very thin, and can be easily removed with water jet at a low water pressure. Accordingly, should such a water jet process step be required, peeling of the metal plated layers can be prevented almost always. And there is no problem if the lead frame is plated with these metal layers beforehand.

It should be noted that level differences are formed between the die pad 14 and the back surface of the resin encapsulant 19 and between the respective back surfaces of the signal-connecting leads 9 and the resin encapsulant 17. This is because the plastic film 12 softens and thermally shrinks owing to the heat applied to the die assembly during the encapsulation, and the die pad 14 and the signal-connecting leads 9 are strongly forced into the plastic film 12. Accordingly, in this structure, the die pad 14 and the signal-connecting leads 9 protrude downward from the back surface of the resin encapsulant 19. As a result, standoff heights (or protrusion heights) can be secured for the die pad 14 and the external terminals 20, i.e., the respective lower parts of the signal-connecting leads 9. For example, in this embodiment, since the thickness of the plastic film 12 is 50 $\mu$m, the protrusion heights may be about 20 $\mu$m.

As can be understood, by adjusting the thickness of the plastic film 12, the height of the protruding portion of each external terminal 20 measured from the back surface of the resin encapsulant can be maintained within an appropriate range. This means that the standoff height of each external terminal 20 can be controlled only by adjusting the thickness of the plastic film 12. That is to say, there is no need to separately provide means or step for controlling the standoff height, which is extremely advantageous to mass production in terms of the process control cost. The thickness of the plastic film 12 is preferably in the range from about 10 $\mu$m to about 150 $\mu$m.

It should be noted that the plastic film 12 may be made of any material having predetermined hardness, thickness and thermal softening properties suitable for a desired protrusion height. In this embodiment, the standoff heights of the die pad 14 and the external terminals 20 may also be adjusted by regulating the pressure applied to the plastic film 12. For example, the standoff heights may be set at approximately 0 $\mu$m if necessary.

Embodiment 2

Figure 8:
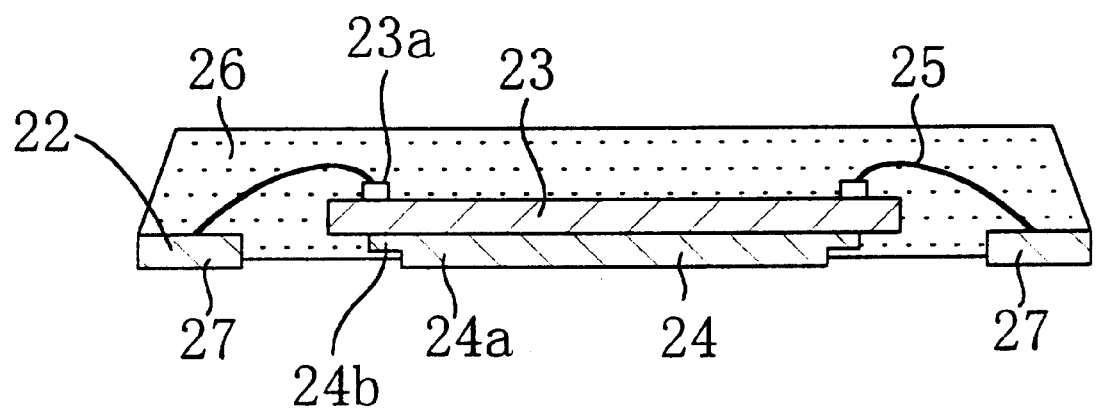
FIG. 8 is a cross-sectional view of a resin-molded semiconductor device according to the second embodiment of the present invention.

Hereinafter, the second embodiment of the present invention will be described with reference to FIG. 8 and FIGS. 9(a) through 9(f). FIG. 8 is a cross-sectional view of a resin-molded semiconductor device of this embodiment. FIGS. 9(a) through 9(f) are cross-sectional views illustrating respective process steps for manufacturing the resin-molded semiconductor device of this embodiment. The structure and manufacturing process of the lead frame of this embodiment have a lot in common with the first embodiment. Thus, the illustration of the lead frame alone is omitted herein.

Structures of lead frame and resin-molded semiconductor device

As shown in FIG. 8, the resin-molded semiconductor device of this embodiment includes a lead frame consisting of signal-connecting leads 22 and a die pad 24 for supporting a semiconductor chip 23 thereon. The semiconductor chip 23 is bonded onto the die pad 24 with an adhesive and electrode pads 23a of the chip 23 are electrically connected to the signal-connecting leads 22 with metal fine wires 25. And the signal-connecting leads 22, die pad 24, semiconductor chip 23 and metal fine wires 25 are encapsulated within a resin encapsulant 26.

The resin-molded semiconductor device of this embodiment is characterized by the shape and position of the lower part of the die pad 24. Specifically, the lower part of the die pad 24 has a stepped structure, which is formed by half etching or the like and includes a convex portion 24a at the center thereof and a flange portion 24b surrounding the convex portion 24a. And only lower part of the convex portion 24a protrudes from the back surface of the resin encapsulant 26. Accordingly, after the chip, frame and so on have been encapsulated with the resin encapsulant 26, a thin layer of the resin encapsulant 26 exists under the flange portion 24b and around the convex portion 24a of the die pad 24.

Also, no resin encapsulant 26 exists on the respective lower parts of the signal-connecting leads 22. In other words, the respective lower surfaces of the signal-connecting leads 22 are exposed, and are used as interconnection with a motherboard. That is to say, the respective lower parts of the signal-connecting leads 22 function as external terminals 27.

Virtually no resin burr, which ordinarily sticks out during the step of encapsulating, exists on the exposed convex portion 24a of the die pad 24 and on the external terminals 27. And the convex portion 24a of the die pad 24 and the external terminals 27 can be easily formed in such shapes by the process described later.

In the resin-molded semiconductor device of this embodiment, the lower part of the die pad 24 has a stepped structure including the convex portion 24a at its center and only lower part of the convex portion 24a is exposed out of the resin encapsulant 26. Accordingly, the resin encapsulant 26 can hold the die pad 24 more strongly, thus improving the reliability of the resin-molded semiconductor device.

Also, since the holding force increases, adhesion between the resin encapsulant 26 and the die pad 24 also increases, which prevents the penetration of water or moisture through the boundary therebetween, resulting in increase of moisture resistance of the device. Consequently, the reliability of the resin-molded semiconductor device further improves.

Moreover, both the die pad 24 and the signal-connecting leads 22 are exposed on substantially the same plane and no resin burr exists on the lower surface of the convex portion 24a. Accordingly, the convex portion 24a can be bonded onto a motherboard with much more reliability and heat radiation characteristics of the device can be improved.

Also, the lower surface of the die pad 24 is exposed to be a heat-radiating face and virtually no resin burr, which ordinarily sticks out during the step of encapsulating, exists on the external terminals 27. And the convex portion 24a of the die pad 24 and the external terminals 27 slightly protrude downward from the back surface of the resin encapsulant 26. The die pad 24 and the external terminals 27 can be easily formed to protrude downward and have no resin burr thereon if encapsulation is performed with a plastic film attached to the respective lower surfaces of the die pad 14 and the signal-connecting leads 22.

In this embodiment, no outer leads, ordinarily functioning as external terminals, exist around the signal-connecting leads 22. Instead, the respective lower parts of the signal-connecting leads 22 function as external terminals 27. Accordingly, such a structure contributes to downsizing of a semiconductor device.

Furthermore, the external terminals 27 and the die pad 24 are formed to protrude from the plane of the resin encapsulant 26. Accordingly, standoff heights, which should be secured for connecting the external terminals 27 and the die pad 24 to electrodes of a motherboard during mounting of a resin-molded semiconductor device onto the motherboard, have already been provided for the external terminals 27 and the die pad 24. Thus, the external terminals 27 can be used as external electrodes as they are, and there is no need to attach solder balls or the like to the external terminals 27 during mounting of the device on the motherboard. As a result, number of process steps and manufacturing cost can be advantageously reduced.

Method for manufacturing resin-molded semiconductor device

Next, a method for manufacturing the resin-molded semiconductor device of this embodiment will be described with reference to the drawings. FIGS. 9(a) through 9(f) are cross-sectional views illustrating respective process steps for manufacturing the resin-molded semiconductor device of this embodiment.

First, in the process step shown in FIG. 9(a), a lead frame 30 is prepared. The lead frame 30 includes: a main lead frame unit having an outer frame and leads consisting of signal-connecting leads 22 and outer leads; a plastic film 28 attached to the lower surface of the main lead frame unit; and a die pad 24 secured onto the plastic film 28 inside an opening 29 of the main lead frame unit. As in the first embodiment, the lead frame 30 prepared is not provided with any support leads and any dam bars, which are ordinarily used for preventing the outflow of a resin encapsulant during the step of encapsulating, either.

Next, in the process step shown in FIG. 9(b), a semiconductor chip 23 is mounted and bonded, with an adhesive, onto the die pad 24 of the lead frame 30 prepared. This process step is so-called "die bonding".

Then, in the process step shown in FIG. 9(c), electrode pads 23a of the semiconductor chip 23, bonded onto the die pad 24, are electrically connected to the signal-connecting leads 22 with metal fine wires 25. This process step is so-called "wire bonding".

Subsequently, in the process step shown in FIG. 9(d), the lead frame 30, in which the semiconductor chip 23 has been bonded onto the die pad 24 and to whose lower surface the plastic film 28 has been attached, is introduced into a die assembly. Then, a resin encapsulant 26 is poured into the die assembly with the outer leads and the outer frame of the lead frame 30 and the plastic film 28 pressed by upper and lower dies of the die assembly. In this manner, the signal-connecting leads 22, semiconductor chip 23, metal fine wires 25 and die pad 24 are encapsulated within the resin encapsulant 26. In this process step, the plastic film 28 also prevents the formation of resin burr and makes the respective lower parts of the signal-connecting leads 22 protrude downward from the lower surface of the resin encapsulant 26 as in the first embodiment.

Next, in the process step shown in FIG. 9(e), the plastic film 28, which has been attached to the respective lower surfaces of the convex portion 24a of the die pad 24 and the signal-connecting leads 22, is peeled off and removed. As a result, the respective lower parts of the convex portion 24a of the die pad 24 and the external terminals 27 protrude downward from the back surface of the resin encapsulant 26.

Finally, in the process step shown in FIG. 9(f), the outer leads of the leads are cut off in the boundary between the outer leads and the signal-connecting leads 22. Consequently, a resin-molded semiconductor device, in which the end faces of the signal-connecting leads 22 are located on substantially the same plane as the side faces of the resin encapsulant 26, is completed.

The resin-molded semiconductor device shown in FIG. 9(f) can be manufactured easily by the method of this embodiment to make only part of the convex portion 24a of the die pad 24 protrude from the lower surface of the resin encapsulant 26, which also exists under the flange portion 24b around the convex portion 24a.

In addition, in accordance with the method of this embodiment, the plastic film 28 is attached to the respective lower surfaces of the convex portion 24a of the die pad 24 and the signal-connecting leads 22 before the step of encapsulating. Accordingly, the resin encapsulant 26 cannot reach, and no resin burr is formed on, the respective lower surfaces of the convex portion 24a of the die pad 24 and the signal-connecting leads 22 functioning as external terminals 27 during the encapsulation. Thus, resin burr need not be removed from the respective lower surfaces of the convex portion 24a of the die pad 24 or the external terminals 27 using water jet or the like, unlike a conventional method for manufacturing a resin-molded semiconductor device with the lower surfaces of signal-connecting leads 22 entirely exposed. That is to say, since this troublesome step of deburring can be omitted, this process is simple enough to mass-produce a great number of resin-molded semiconductor devices. In addition, peeling of metal plated layers such as Ni, Pd and Au from the lead frame and deposition of impurities, which might happen during the conventional process step of deburring using water jet, can be eliminated. Accordingly, these metal plated layers can be formed before the step of encapsulating as in the first embodiment.

It should be noted that level differences are formed between the convex portion 24a of the die pad 24 and the back surface of the resin encapsulant 26 and between the respective lower surfaces of the signal-connecting leads 22 and the resin encapsulant 26. This is because the plastic film 28 softens and thermally shrinks owing to the heat applied to the die assembly during the encapsulation, and the convex portion 24a of the die pad 24 and the signal-connecting leads 22 are strongly forced into the plastic film 28. Accordingly, in this structure, the convex portion 24a of the die pad 24 and the signal-connecting leads 22 protrude from the back surface of the resin encapsulant 26. As a result, standoff heights (or protrusion heights) can be secured for the convex portion 24a of the die pad 24 and the external terminals 27, i.e., the respective lower parts of the signal-connecting leads 22. For example, in this embodiment, since the thickness of the plastic film 28 is 50 $\mu$m, the protrusion heights may be about 20 $\mu$m. As can be understood, by adjusting the thickness of the plastic film 28, the height of the protruding portion of each external terminal 27 measured from the back surface of the resin encapsulant can be maintained within an appropriate range. This means that the standoff height of each external terminal 27 can be controlled only by adjusting the thickness of the plastic film 28. That is to say, there is no need to separately provide means or step for controlling the standoff height, which is extremely advantageous to mass production in terms of the process control cost. It should be noted that the plastic film 28 may be made of any material having predetermined hardness, thickness and thermal softening properties suitable for a desired protrusion height.

Embodiment 3

Next, the third embodiment of the present invention will be described.

The fundamental structure of the resin-molded semiconductor device of this embodiment is the same as that of the first embodiment. This embodiment is different from the first embodiment only in the shape of the die pad used. Thus, in this embodiment, only the shape of the die pad will be described and description of the other parts will be omitted.

Figure 10:
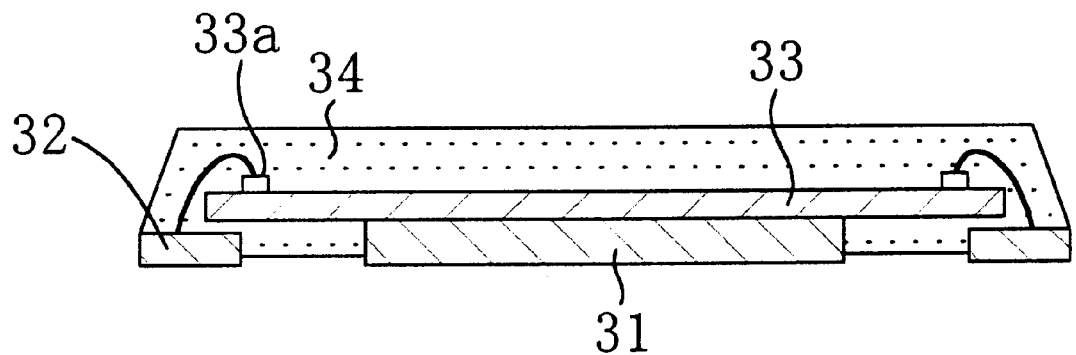
FIG. 10 is a cross-sectional view of a resin-molded semiconductor device according to the third embodiment of the present invention.

FIG. 10 is a cross-sectional view of a resin-molded semiconductor device of this embodiment. As shown in FIG. 10, a die pad 31 is thicker than signal-connecting leads 32 in the lead frame of this embodiment.

In the resin-molded semiconductor device of this embodiment, since the die pad 31 is thicker than the signal-connecting leads 32, a semiconductor chip 33 having an larger area than that of the die pad 31 can be mounted on the pad 31 easily. Accordingly, the semiconductor chip 33 may partially overlap with the signal-connecting leads 32 as shown in FIG. 10. Specifically, the outer peripheral region of the semiconductor chip 33 may overhang the inner peripheral ends of the signal-connecting leads 32. That is to say, the resin-molded semiconductor device can be remarkably downsized.

Also, since a resin encapsulant 34 is attached to a much greater area on the lower surface of the semiconductor chip 33, adhesion between the resin encapsulant 34 and the semiconductor chip 33 considerably increases. As a result, a resin-molded semiconductor device with good moisture resistance is realized.

Moreover, since the restriction on the size of a semiconductor chip 33 is tremendously lightened with such a die pad 31, this lead frame is advantageously applicable to semiconductor chips of various sizes in common. That is to say, the applicable range of this lead frame is very much broader, thus contributing to even more efficient manufacturing.

Embodiment 4

Next, the fourth embodiment of the present invention will be described.

The fundamental structure of the resin-molded semiconductor device of this embodiment is the same as that of the second embodiment. This embodiment is different from the second embodiment only in the shape of the die pad used. Thus, in this embodiment, only the shape of the die pad will be described and description of the other parts will be omitted.

Figure 11:
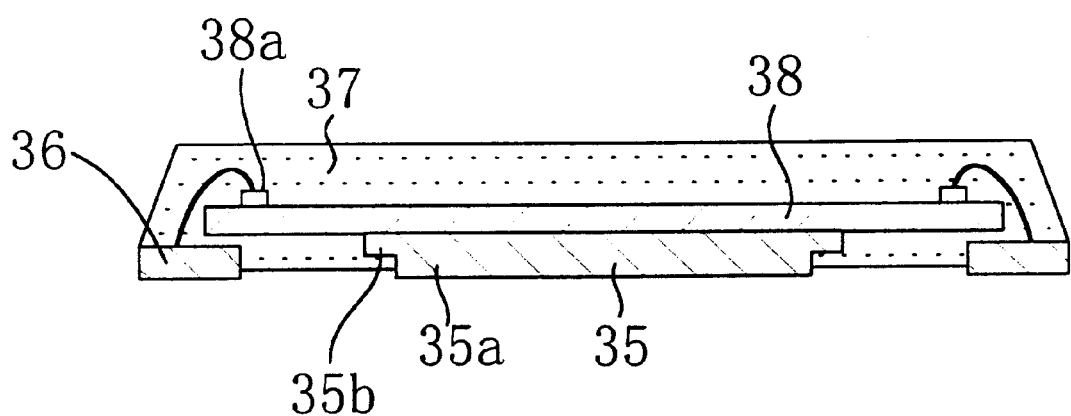
FIG. 11 is a cross-sectional view of a resin-molded semiconductor device according to the fourth embodiment of the present invention.

FIG. 11 is a cross-sectional view of the resin-molded semiconductor device of this embodiment. In the lead frame of this embodiment shown in FIG. 11, a die pad 35 is also thicker than signal-connecting leads 36 like the lead frame of the third embodiment. In addition, the lower part of the die pad 35 is provided with a convex portion 35a formed by half etching, etc. like the lead frame of the second embodiment.

In the resin-molded semiconductor device of this embodiment, the lower part of the die pad 35 in the lead frame has a stepped structure in which a convex portion 35a is formed at its center, and only the lower part of the convex portion 35a is exposed out of a resin encapsulant 37. Accordingly, the resin encapsulant 37 can hold the die pad 35 more strongly, thus improving the reliability of the resin-molded semiconductor device. Moreover, since the die pad 35 is thicker than the signal-connecting leads 36, a semiconductor chip 38 having a much greater area than that of the die pad 35 can be mounted thereon easily. That is to say, the effects of the second and third embodiments can be attained at the same time.

Embodiment 5

Next, the fifth embodiment of the present invention will be described.

The fundamental structure of the resin-molded semiconductor device of this embodiment is the same as that of the first embodiment. This embodiment is different from the first embodiment only in the shape of signal-connecting leads used. Thus, in this embodiment, only the shape of the signal-connecting leads will be described and description of the other parts will be omitted.

Figure 12:
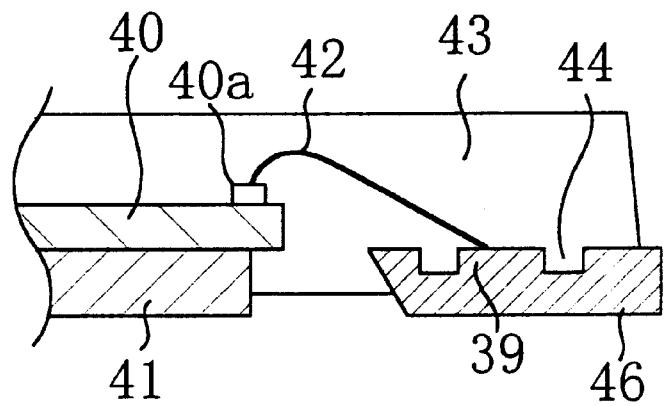
FIG. 12 is a partial cross-sectional view illustrating only part of a resin-molded semiconductor device according to the fifth embodiment of the present invention.
Figure 13C:
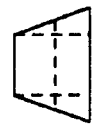
FIG. 13(c) is a front view of the signal-connecting lead.
Figure 13B:
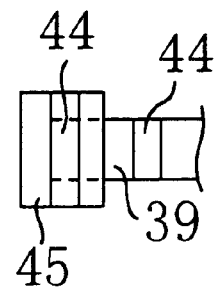
FIG. 13(b) is a partial plan view of the signal-connecting lead.
Figure 13A:
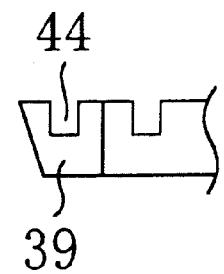
FIG. 13(a) is a partial side view of a signal-connecting lead in the fifth embodiment.

FIG. 12 is a partial cross-sectional view illustrating only part of the resin-molded semiconductor device of this embodiment. FIGS. 13(a) through 13(c) are views illustrating a more detailed structure of a signal-connecting lead 39 of the device shown in FIG. 12. FIG. 13(a) is a partial side view of the signal-connecting lead 39; FIG. 13(b) is a partial plan view thereof; and FIG. 13(c) is a front view thereof.

As shown in FIG. 12 and FIGS. 13(a) through 13(c), the resin-molded semiconductor device of this embodiment includes a signal-connecting lead 39 and a die pad 41 for supporting a semiconductor chip 40 thereon. The semiconductor chip 40 has been bonded onto the die pad 41 with an adhesive. An electrode pad 40a of the semiconductor chip 40 is electrically connected to the signal-connecting lead 39 with a metal fine wire 42. And the signal-connecting lead 39, the die pad 41, the semiconductor chip 40 and the metal fine wire 42 are encapsulated within a resin encapsulant 43.

The signal-connecting lead 39 of this embodiment is characterized by including two groove portions 44 in the upper surface thereof and an increased width portion 45 as its side portion. And the metal fine wire 42 connects the region between the two groove portions 44 in the upper surface of the signal-connecting lead 39 to the electrode pad 40a of the semiconductor chip 40.

Since the signal-connecting lead 39 is provided with the groove portions 44 and the increased width portion 45, adhesion between the signal-connecting lead 39 and the resin encapsulant 43 can be improved, i.e., anchoring effects can be attained. Accordingly, stress applied to the external terminal 46 and to the metal fine wire 42 can be relaxed, thus securing sufficiently high reliability for the final product. Specifically, it is possible to prevent the external terminal 46 from being detached or peeled off from the resin encapsulant 43. When the resin-molded semiconductor device is mounted onto a motherboard, stress is applied to the external terminal 46. However, such stress applied to the external terminal 46 can be cushioned by the groove portions 44 formed in the upper surface of the external terminal 46.

It should be noted that the signal-connecting lead 39 may be formed in any other shape than that shown in FIGS. 13(a) through 13(c). For example, part of the signal-connecting lead 39 connected to the metal fine wire 42 may be located at a position inner to the region between the groove portions 44 located above the external terminal 46. In such a case, the same effects as those attained by the structure shown in FIGS. 13(a) through 13(c) can also be attained. In addition, since the connection length of the metal fine wire 42 can be shortened and the productivity can be improved.

It should be noted that these effects can be attained if either the groove portions 44 or the increased width portion 45 is/are provided for the signal-connecting lead 39.

Embodiment 6

Next, the sixth embodiment of the present invention will be described.

The fundamental structure of the resin-molded semiconductor device of this embodiment is the same as that of the first embodiment. This embodiment is different from the first embodiment only in the shape of signal-connecting leads used. Thus, in this embodiment, only the shape of the signal-connecting leads will be described and description of the other parts will be omitted.

Figure 14:
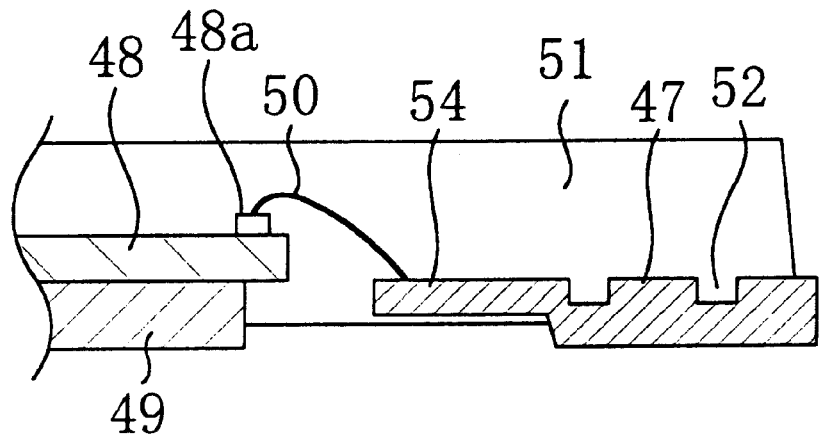
FIG. 14 is a partial cross-sectional view illustrating only part of a resin-molded semiconductor device according to the sixth embodiment of the present invention.
Figure 15A:
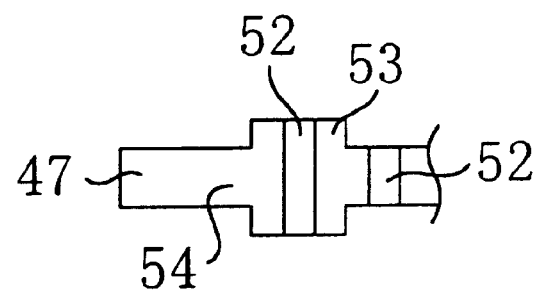
FIG. 15(a) is a partial plan view of a signal-connecting lead in the sixth embodiment.
Figure 15B:
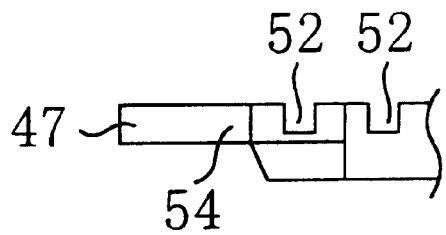
FIG. 15(b) is a partial side view of the signal-connecting lead.

FIG. 14 is a partial cross-sectional view illustrating only part of the resin-molded semiconductor device of this embodiment. FIGS. 15(a) and 15(b) are views illustrating a more detailed structure of a signal-connecting lead 47 of the device shown in FIG. 14. FIG. 15(a) is a partial plan view of the signal-connecting lead 47; and FIG. 15(b) is a partial side view thereof.

As shown in FIG. 14, the resin-molded semiconductor device of this embodiment includes: a signal-connecting lead 47; a die pad 49 for supporting a semiconductor chip 48 thereon; and a metal fine wire 50 for electrically connecting an electrode pad 48a of the semiconductor chip 48 to the signal-connecting lead 47. And the signal-connecting lead 47, die pad 49, semiconductor chip 48 and metal fine wire 50 are encapsulated within a resin encapsulant 51.

As shown in FIGS. 15(a) and 15(b), the signal-connecting lead 47 of the resin-molded semiconductor device of this embodiment includes: two groove portions 52 in the upper surface thereof; and an increased width portion 53 having one of the two groove portions 52 thereon. The width of the portion 53 is increased in the direction in which the groove portion 52 extends. The signal-connecting lead 47 further includes a reduced thickness portion 54 formed by half-etching the lower part of the signal-connecting lead 47. The portion 54 is located closer to the die pad 49, i.e., on the inner periphery of the signal-connecting leads 47. And the metal fine wire 50 is connected to the reduced thickness portion 54 of the signal-connecting lead 47.

The resin-molded semiconductor device of this embodiment having such a structure includes the increased width portion 53, groove portions 52 and reduced thickness portion 54 in each signal-connecting lead 47. Thus, the same effects as those of the fifth embodiment can also be attained in this embodiment, because adhesion between the resin encapsulant 51 and each lead 47 can be increased as in the fifth embodiment.

In addition, the signal-connecting lead 47 and the metal fine wire 50 are connected to each other at the reduced thickness portion 54 of the signal-connecting lead 47. Thus, even if stress is applied to this connection portion, the stress can be cushioned by the elastic motion of the reduced thickness portion 54. Accordingly, it is advantageously possible to prevent the stress from damaging or breaking the connection portion.

Also, if a semiconductor chip of a relatively small size is connected to the signal-connecting lead 47, the length of the metal fine wire 50 can be shorter. Thus, the structure of this embodiment is suitable for a resin-molded semiconductor device having a semiconductor chip of a small size.

In the foregoing embodiments, the lower part of a signal-connecting lead is used as an external connecting terminal. However, the present invention is not limited to such embodiments. For example, outer leads, connected to the signal-connecting leads, may be left and used as external terminals.

What is claimed is:

1. A lead frame comprising:

an outer frame having an opening surrounding a region in which a semiconductor chip is mounted;

a plurality of leads extending inside the opening from the outer frame toward the region in which the semiconductor chip is mounted;

a die pad disposed inside the opening of the outer frame; and a plastic film adhered to respective lower surfaces of the outer frame, the leads and the die pad, wherein the die pad, the outer frame and the leads are separated from each other, and wherein the die pad is secured to the outer frame with the plastic film.

2. The lead frame of claim 1, wherein the die pad is thicker than the leads, and wherein the upper surface of the die pad is located above the upper surfaces of the leads.

3. The lead frame of claim 1, wherein the die pad includes a flange portion on the outer periphery thereof, the lower surface of the flange portion being located above the lower surface of the other portion of the die pad.

4. The lead frame of claim 1, wherein upper part of each said lead is larger in width than lower part thereof, and wherein a plurality of grooves are formed in the upper surface of each said lead.

5. The lead frame of claim 1, wherein each said lead includes a reduced thickness portion facing the die pad, the lower surface of the reduced thickness portion being located above the lower surface of the other portion of the lead.

6. A method for manufacturing a lead frame, comprising the steps of:

a) preparing a main lead frame unit, the main lead frame unit including: an outer frame having an opening surrounding a region in which a semiconductor chip is mounted; and a plurality of leads extending inside the opening from the outer frame toward the region in which the semiconductor chip is mounted, each said lead including a reduced thickness portion at one end thereof closer to the region, the reduced thickness portion being formed by removing lower part of the lead;

b) attaching an adhesive plastic film to the lower surface of the main lead frame unit; and c) securing a die pad onto a region of the plastic film exposed inside the opening of the main lead frame unit.

7. A resin-molded semiconductor device comprising:

a semiconductor chip having electrode pads;

a die pad for supporting the semiconductor chip thereon;

a plurality of leads connected to the electrode pads of the semiconductor chip, each said lead including a reduced thickness portion connected to associated one of the electrode pads and formed by removing lower part of the lead;

a plurality of connecting members for electrically connecting the electrode pads of the semiconductor chip to the leads;

a plurality of external terminals for electrically connecting the leads to an external member, each said external terminal being part of associated one of the leads; and a resin encapsulant for encapsulating the die pad, the semiconductor chip, the leads and the connecting members, wherein respective lower surfaces of the die pad and the leads are not encapsulated with the resin encapsulant but exposed, and wherein the die pad, the outer frame and the leads are separated from each other, and wherein the die pad is substantially supported by the resin encapsulant, and wherein the die pad is thicker than the leads; and wherein the upper surface of the die pad is located above the upper surfaces of the leads.

8. A resin-molded semiconductor device comprising:

a semiconductor chip having electrode pads;

a die pad for supporting the semiconductor chip thereon;

a plurality of leads connected to the electrode pads of the semiconductor chip, each said lead including a reduced thickness portion connected to associated one of the electrode pads and formed by removing lower part of the lead;

a plurality of connecting members for electrically connecting the electrode pads of the semiconductor chip to the leads;

a plurality of external terminals for electrically connecting the leads to an external member, each said external terminal being part of associated one of the leads; and a resin encapsulant for encapsulating the die pad, the semiconductor chip, the leads and the connecting members, wherein respective lower surfaces of the die pad and the leads are not encapsulated with the resin encapsulant but exposed, and wherein the die pad, the outer frame and the leads are separated from each other, and wherein the die pad is substantially supported by the resin encapsulant; and wherein the die pad includes a flange portion on the outer periphery thereof, the lower surface of the flange portion being located above the lower surface of the other portion of the die pad.

9. A resin-molded semiconductor device comprising:

a semiconductor chip having electrode pads;

a die pad for supporting the semiconductor chip thereon;

a plurality of leads connected to the electrode pads of the semiconductor chip, each said lead including a reduced thickness portion connected to associated one of the electrode pads and formed by removing lower part of the lead;

a plurality of connecting members for electrically connecting the electrode pads of the semiconductor chip to the leads;

a plurality of external terminals for electrically connecting the leads to an external member, each said external terminal being part of associated one of the leads; and a resin encapsulant for encapsulating the die pad, the semiconductor chip, the leads and the connecting members, wherein respective lower surfaces of the die pad and the leads are not encapsulated with the resin encapsulant but exposed, and wherein the die pad, the outer frame and the leads are separated from each other, and wherein the die pad is substantially supported by the resin encapsulant, and wherein upper part of each said lead is larger in width than lower part thereof, and wherein a plurality of grooves are formed in the upper surface of each said lead.

10. A resin-molded semiconductor device comprising:

a semiconductor chip having electrode pads;

a die pad for supporting the semiconductor chip thereon;

a plurality of leads connected to the electrode pads of the semiconductor chip, each said lead including a reduced thickness portion connected to associated one of the electrode pads and formed by removing lower part of the lead;

a plurality of connecting members for electrically connecting the electrode pads of the semiconductor chip to the leads;

a plurality of external terminals for electrically connecting the leads to an external member, each said external terminal being part of associated one of the leads; and a resin encapsulant for encapsulating the die pad, the semiconductor chip, the leads and the connecting members, wherein respective lower surfaces of the die pad and the leads are not encapsulated with the resin encapsulant but exposed, and wherein the die pad, the outer frame and the leads are separated from each other, and wherein the die pad is substantially supported by the resin encapsulant; and wherein respective lower parts of the die pad and the leads protrude downward from the lower surface of the resin encapsulant, and wherein the respective lower parts of the leads function as the external terminals.

11. A method for manufacturing a resin-molded semiconductor device, comprising the steps of:

a) preparing a lead frame, the lead frame comprising: an outer frame having an opening; a plurality of leads extending inside the opening from the outer frame toward a region in which a semiconductor chip is mounted; a die pad disposed inside the opening of the outer frame; and a plastic film adhered to respective lower surfaces of the outer frame, the leads and the die pad, the die pad, the outer frame and the leads being separated from each other, the die pad being secured to the outer frame with the plastic film;

b) mounting the semiconductor chip onto the die pad of the lead frame;

c) electrically connecting the semiconductor chip to the leads with connecting members;

d) pouring a resin encapsulant into a die assembly while applying pressure to the outer frame and respective parts of the leads of the lead frame to encapsulate the semiconductor chip, the parts of the leads, the connecting members and the die pad within the resin encapsulant on the upper surface of the plastic film, the parts of the leads being closer to the outer frame;

e) removing the plastic film after the encapsulation, thereby exposing the respective lower surfaces of the die pad and the leads; and f) cutting off parts of the leads protruding outward from the resin encapsulant, thereby separating the outer frame from the leads.

12. The method of claim 11, wherein in the step d), the pressure is adjusted such that lower part of each said lead protrudes downward from the lower surface of the resin encapsulant.

13. The method of claim 11, wherein in the step a), upper part of each said lead is larger in width than lower part thereof, and a plurality of grooves are formed in the upper surface of each said lead.

14. The method of claim 11, wherein in the lead frame prepared in the step a), each said lead includes a reduced thickness portion facing the die pad, the lower surface of the reduced thickness portion being located above the lower surface of the other portion of the lead.

* * * * *